United States Patent
Kummerl et al.

(10) Patent No.: US 8,569,082 B2
(45) Date of Patent: Oct. 29, 2013

(54) SEMICONDUCTOR PACKAGE WITH A MOLD MATERIAL ENCAPSULATING A CHIP AND A PORTION OF A LEAD FRAME

(75) Inventors: Steven A. Kummerl, Carrollton, TX (US); Sreenivasan K Koduri, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/244,384

(22) Filed: Sep. 24, 2011

(65) Prior Publication Data

US 2012/0015479 A1 Jan. 19, 2012

Related U.S. Application Data

(62) Division of application No. 12/411,713, filed on Mar. 26, 2009, now Pat. No. 8,072,770.

(60) Provisional application No. 61/105,288, filed on Oct. 14, 2008.

(51) Int. Cl.
| | |
|---|---|
| H01L 21/66 | (2006.01) |
| H01L 21/00 | (2006.01) |
| H01L 23/02 | (2006.01) |
| H01L 23/28 | (2006.01) |

(52) U.S. Cl.
USPC ............ 438/26; 438/15; 438/55; 438/106; 438/124; 438/127; 257/678; 257/787

(58) Field of Classification Search
USPC ........ 257/678–733, 787–796; 438/15, 26, 51, 438/55, 64, 106, 124, 127
See application file for complete search history.

(56) References Cited

U.S. PATENT DOCUMENTS

| 7,968,800 | B2 * | 6/2011 | Sasaoka et al. ............... 174/258 |
| 8,159,828 | B2 * | 4/2012 | Sun et al. ...................... 361/761 |
| 2004/0100772 | A1 * | 5/2004 | Chye et al. .................... 361/702 |
| 2005/0205981 | A1 * | 9/2005 | Yoshimura et al. ........... 257/686 |
| 2007/0059918 | A1 * | 3/2007 | Jung et al. ..................... 438/618 |
| 2010/0044878 | A1 * | 2/2010 | Ha et al. ........................ 257/777 |

* cited by examiner

*Primary Examiner* — Ha Tran T Nguyen
*Assistant Examiner* — Thai T Vuong
(74) *Attorney, Agent, or Firm* — Steven A. Shaw; W. James Brady; Frederick J. Telecky, Jr.

(57) ABSTRACT

Various exemplary embodiments provide components, devices, and methods of semiconductor packaging. The disclosed packaging component can include a mold material disposed around a lead frame and at least an integrated circuit (IC), wherein the IC is electrically connected with one side of the lead frame. The opposite side of the lead frame including, for example, lead segments, can be exposed from the mold material. A variety of other components, devices, and packages can then be assembled, e.g., over the disclosed packaging component, through the exposed regions so as to improve packaging densities.

9 Claims, 2 Drawing Sheets

SEMICONDUCTOR PACKAGE WITH A MOLD MATERIAL ENCAPSULATING A CHIP AND A PORTION OF A LEAD FRAME

RELATED APPLICATIONS

This is a divisional of application Ser. No. 12/411,713 filed Mar. 26, 2009 and claims priority from U.S. Provisional Patent Application Ser. No. 61/105,288, filed Oct. 14, 2008, which is hereby incorporated by reference in its entirety.

DESCRIPTION OF THE INVENTION

1. Field of the Invention

The present invention relates generally to the field of semiconductor device packaging, and more specifically to device packaging over a mold material.

2. Background of the Invention

A lead frame-based semiconductor device package is the most widely used integrated circuit (IC) package. The lead frame typically includes a chip mount pad (also referred to as a die paddle) for attaching the IC die or chip to the leadframe, and a plurality of lead fingers or conductive segments (pins) which provide a conductive path between the chip and external circuits. A gap between the inner end of the lead fingers and the chip is typically bridged with bond wires attached to bond pads on the chip and to the inner end of the lead fingers. The outer ends of the lead fingers remote from the IC chip can be electrically and mechanically connected to external circuitry.

The packaged IC may include semiconductor chips and their associated components, such as passive components or the like embedded within the mold material. The packaged integrated circuits are connected or soldered to a printed circuit board (PCB) of an electric device. Passive components or the like must be placed inside the package so that they can be located on the lead frame inside the mold material. Through the printed circuit board, the packaged integrated circuit may be connected to other chips and to external inputs and outputs.

SUMMARY OF THE INVENTION

The Applicant has discovered that assembling related components outside the mold material of a packaged component has advantages over conventional methods that assemble related components inside the mold material. In various embodiments, this can be accomplished by exposing or extending one or more lead frame fingers (also referred to herein as lead segments) outside the mold material of a leadframe-based IC packaging component, such that related components can be packaged over the mold material rather than inside the mold material.

In one embodiment, the disclosed IC packaging component can include one or more IC chips, for example, wire-bonded or flip-chipped, on one side of the lead frame, while other related components, such as passive components or the like, can be connected or fixed to the opposite side of the lead frame. In this manner, a more efficient utilization of the lead frame can be provided as compared with conventional lead frame based IC packages, where the IC chips and related components are packaged within the mold material and on the same side of the lead frame.

Various related components, such as, for example, passive components, printed circuit boards (PCBs), ball grid arrays (BGAs), other ICs, other packaging components, or combinations thereof, can be packaged in a vertical direction over the IC packaging component through the exposed regions thereof to provide a high packaging density.

In various embodiments, the related components, which are directly or indirectly associated with the IC chips of the packaging component, can be assembled over the exposed lead frame segments, so as to improve package densities. In an exemplary embodiment, a second IC chip can be attached to the top of IC packaging component facing up with a subsequent BGA package attached thereto. In another exemplary embodiment, a combination of laminated PCB, BGA, other ICs, and passive components can be attached on top of the IC packaging component to communicate with the integrated circuit of the packaging component.

It is a technical advantage of various embodiments of the invention that exposing lead segments out from a mold material of a packaging component provides a high packaging density method for assembling a variety of components with the IC packaging component.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

Figure 1:
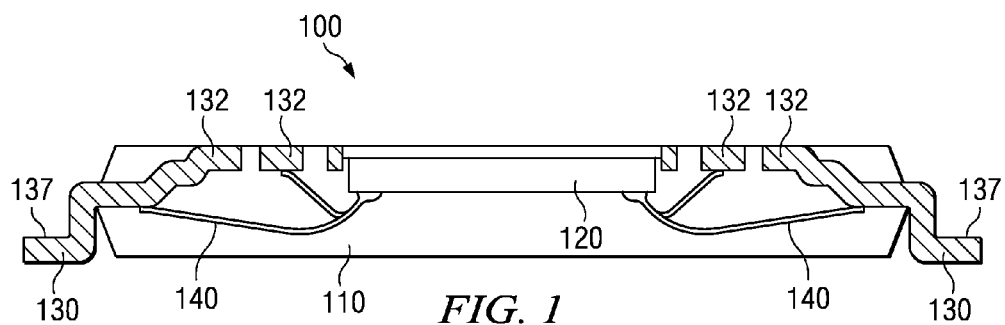
FIG. 1 is a schematic cross section depicting a first embodiment of the invention of semiconductor packaging in accordance with the present teachings.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

The Applicant has realized that new packaging devices and methods are needed to improve the packaging density for the IC industry. Reference will now be made in detail to exemplary embodiments of the invention, examples of which are illustrated in the accompanying drawings. Wherever possible, the same reference numbers will be used throughout the drawings to refer to the same or like parts.

Various exemplary embodiments provide components, devices, and methods of semiconductor packaging. The disclosed packaging component can include a mold material, disposed around a lead frame and at least an integrated circuit (IC), wherein the IC is electrically connected with one side of the lead frame. The opposite side of the lead frame including, for example, lead segments, can be exposed or extended from the mold material. A variety of other related components, devices, and packages can then be assembled, e.g., on top of the disclosed packaging component (rather than within the mold material as known in the prior art), through the exposed lead segments so as to improve packaging densities. The lead frame can also include external lead pins extending outside the mold material for an external connection as known to one of ordinary skill in the art.

As used herein, the term "related components" or "other related components" refers to all possible components or devices that need to be packaged with the components in the mold material, for example, which can include at least an IC in the mold material. The "related components" can include, but are not limited to, passive components, printed circuit boards (PCBs), ball grid arrays (BGAs), other ICs, other packaging components, or combinations thereof.

As used herein, the term "lead segments" or "lead frame segments" refers to a first set of one or more portions or fingers of the lead frame, wherein the "lead segments" are exposed or extended from the mold material and are accessible from a vertical direction for packaging subsequently with various "related components". In various embodiments, the exposed "lead segments" can allow the vertically packaged "related components" and the exemplary IC in the mold material to be packaged on opposite sides of the lead frame.

As used herein, the term "vertical direction" refers to a direction that is about normal to a surface of the mold material. For example, various related components can be packaged, in a vertical direction that is on top of the mold material, with the IC located in the mold material. In various embodiments, the "vertical direction" also refers to a direction that is about normal to a substrate (e.g., a wafer surface) of the exemplary IC packaged in the mold material.

As used herein, the term "lead pins" or "external lead pins" refers to a second set of one or more portions or fingers of the lead frame, wherein the "lead pins" are extended outside the mold material for an external connection, for example, to a printed circuit board (PCB). Through the PCB, the packaged IC can be connected to, for example, external inputs and outputs, as known to one of ordinary skill in the art.

FIG. 1 is a schematic cross section depicting an exemplary IC packaging component 100 in accordance with the present teachings. The IC packaging component 100 can include a mold material 110, an IC 120, a lead frame 130, and wire bonds 140. It should be readily apparent to one of ordinary skill in the art that the component 100 depicted in FIG. 1 represents a generalized schematic illustration and that other components/devices can be added or existing components/devices can be removed or modified.

As shown, the IC 120 can be wire bonded to the lead frame 130 by the wire bonds 140, while the IC 120, a portion of the lead frame 130 and the wire bonds 140 can be held in position by the mold material 110. Note that although one integrated circuit IC is shown in FIG. 1, one of ordinary skill in the art will understand that a plurality of ICs as well as other related components can be disposed in the mold material 110. In addition, while the wire bonds are used for connecting IC 120 to the lead frame 130, various other connections can be used for packaging component 100. For example, the IC 120 can be flip-chip mounted onto the lead frame 130.

The integrated circuit 120, alone or in combination with other related components, can include a variety of different features, including, but not limited to, analog and/or digital circuits such as digital to analog converters, computer processor units, amplifiers, digital signal processors, controllers, transistors, or other semiconductor features. The integrated circuit 120 can include a variety of materials including silicon, gallium arsenide, or other suitable materials.

The integrated circuit 120 can be connected with the lead frame 130, e.g., on one side of the lead frame 130, through the bond wires 140. In one embodiment, the bond wires 140 can conductively bridge an inner side of the lead frame 130 with the IC 120, e.g., by attaching to a bond pad (not shown) on the IC 120. Bond wires can be formed from various materials, such as gold, copper, aluminum, or other conductive materials as known to one of ordinary skill in the art.

The lead frame 130 can have a portion assembled inside the mold material 110 and can further have a plurality of portions or fingers including, for example, the lead frame segments 132 exposed from the mold material 110 for a further packaging process. The lead frame 130 can also include external lead pins 137 protruded from the mold material 110 for external electrical connections.

For example, the lead frame 130 can include one or more lead frame segments 132 exposing the other side (e.g., opposite to the wire bonded side) of the lead frame 130 from the mold material 110 to the outside. Other components including for example, passive components, printed circuit boards (PCBs), ball grid arrays (BGAs), other ICs or combinations thereof, which are conventionally packaged in the mold material, can then be assembled over the exposed side of the lead frame 130 to provide a high packaging density.

The lead frame 130 can also include a plurality of external lead pins 137. The external lead pins 137 can be an extension of the lead frame 130. In various embodiments, the outer ends of the external lead pins 137 remote from the IC 120 can be electrically and mechanically connected to external circuits. For example, the external lead pins 137 can extend outside of the mold material 110 or the packaging component 100 and can be utilized to establish connections between the packaging component 100 and, for example, a circuit board, when the semiconductor packaging component 100 is mounted to the circuit board. The lead frame 130 can therefore provide a conductive path between the IC 120 and external circuits through the lead pins 137.

During manufacture of the integrated circuit packaging component 100, the IC 120 and other components, if there are any, can be connected to (e.g., wire bonded or flip-chipped) the lead frame 130. For example, the IC 120 can be wire bonded to the lead frame 130 using wire bond connections 140. After assembly of the IC chip 120 to the lead frame 130, the mold material 110 can be placed around the IC 120, the bonding wires 140, and a portion of the lead frame 130. One suitable molding process can include an injection molding process. However, other suitable molding processes including, for example, transfer molding or casting can be utilized to place mold material around the components. During molding, the portion of the lead pins 137 can be left extending outside of the mold material 110 to establish connections with external components.

In various embodiments, a removable substrate (not shown) can be used during the packaging process. For example, the IC 120 and/or other components, and the lead frame 130 can be first placed on the substrate, e.g., a polyimide-based adhesive or tape. After connecting the IC 120 and the lead frame 130, the molding process can be conducted to place the mold material 110 around these components in order to form the packaging component 100 as shown in FIG. 1. After the molding process, the substrate can be removed to leave the component 100.

The mold material 110, which surrounds and holds the integrated circuit 120, the lead frame 130 and the wire bonds 140 in position, can include, for example, transfer molding compounds incorporating fused silica particles or castable compounds.

In various embodiments, the exposed regions of the packaging component 100, i.e., the top ends of the exposed lead frame segments 132, can provide a variety of subsequent packaging platforms for a high device density. FIGS. 2-6 depict various exemplary embodiments for subsequent packaging using the package component and method described for FIG. 1 in accordance with the present teachings.

Figure 2:
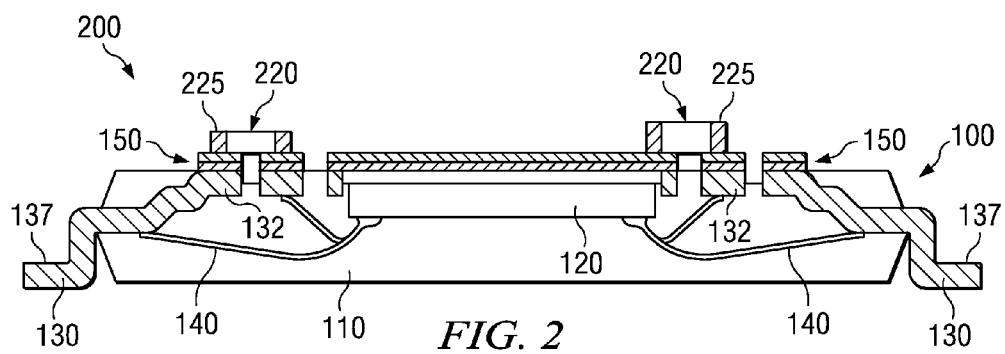
FIG. 2 is a schematic cross section depicting a second embodiment of the invention using the semiconductor package of FIG. 1 in accordance with the present teachings.

FIG. 2 depicts a first example for semiconductor packaging using the component and method shown in FIG. 1 in accordance with the present teachings. As shown, the packaged device 200 can include one or more passive components 220 assembled on top of the packaging component 100. Passive components and the like are often assembled inside the mold materials along with IC devices as known in the prior art. By assembling passive components and/or other related components on top of the packaging component 100 through the exposed lead frame segments, various components and/or devices can be packaged vertically, thereby providing high packaging densities.

In various embodiments, a plurality of connection contacts can be used for the disclosed packaging. For example, as shown in FIG. 2, the connection contacts can include contacts 150 for the IC 120 and for the exposed lead frame segments 132 and external lead pins 137 to facilitate related electrical connections. In various embodiments, the connection contacts can include, e.g., a layer of one or more metals including, but not limited to, copper, aluminum, gold, silver, nickel, tin, platinum, or combinations thereof. The connection contacts can include laminated, plated metal(s) and/or patterned metal layer(s). In various embodiments, the connection contacts can include one or more circuit traces (not shown) radiating outward from the packaging component. In one embodiment, the connection contacts can be a copper pad having a combination of copper, nickel and gold. In another embodiment, the connection contacts can be a conduct pad having a combination of nickel, palladium, and gold.

In various embodiments, the lead frame 130 including the lead frame segments 132 and the external lead pins 137 can be flood-plated with one or more metals described above, wherein the plated metal(s) can be present everywhere (not illustrated in the figures) on all the portions of the lead frame.

The passive components 220 can include, but are not limited to, capacitors, inductors, or resistors. The passive component 220 can be electrically connected with the integrated circuit 120 through the exposed lead frame segments 132 along with the wire bonds 140 positioned between the IC 120 and the lead frame 130. Accordingly, the passive components 220 can include a wire bond termination 225 as shown in FIG. 2. In various embodiments, the passive component 220 can also be connected with the IC contacts 150 through one wire bond termination 225 so as to communicate with the IC 120.

Figure 3:
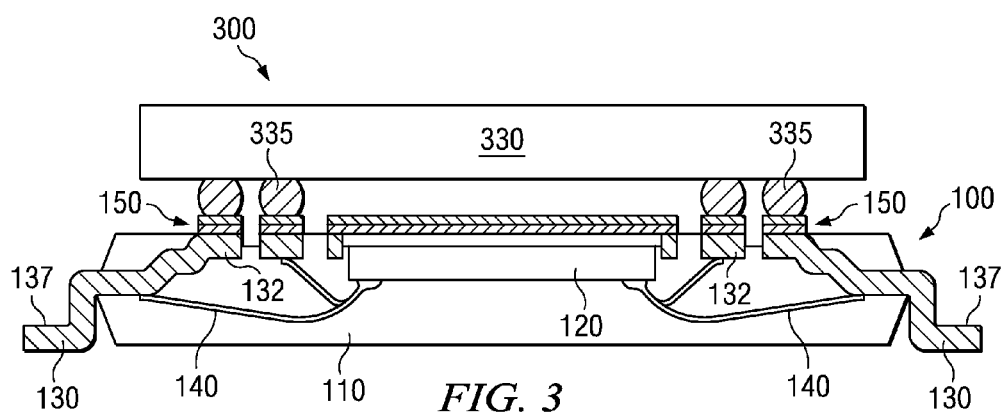
FIG. 3 is a schematic cross section depicting a third embodiment of the invention using the semiconductor package of FIG. 1 in accordance with the present teachings.

FIG. 3 depicts a second example for semiconductor packaging using the component and method shown in FIG. 1 in accordance with the present teachings. The packaged device 300 can include an exemplary ball grid array (BGA) package structure 330 assembled on top of the packaging component 100.

For example, the BGA package structure 330 can include a substrate used as a chip carrier, wherein an IC chip (also referred to as a BGA IC chip) (not shown) can be arranged on one surface (e.g., top surface) of the substrate to electrically connect a conductive structure, and a plurality of solder balls, e.g., the balls 335, can be mounted on the opposite surface of the substrate to electrically connect the conductive structure. The solder balls 335 can further be mounted on other electric components, such as the packaging component 100, through the conductive structure and the solder balls.

In the illustrated example, the solder balls 335 can be electrically connected with, e.g., the exposed lead frame segments 132, and thus communicate with the IC 120 through bond wires 140. In various embodiments, as shown in FIG. 3, any BGA structures known to one of ordinary skill in the art can be packaged on top of the packaging component 100 to communicate with the IC 120 through the solder balls 335 and the exposed lead frame segments 132. For example, the solder balls 335 can be small eutectic solder balls that are generally about 0.012 inch in diameter and generally formed of a lead/tin alloy as known in the prior art.

Figure 4:
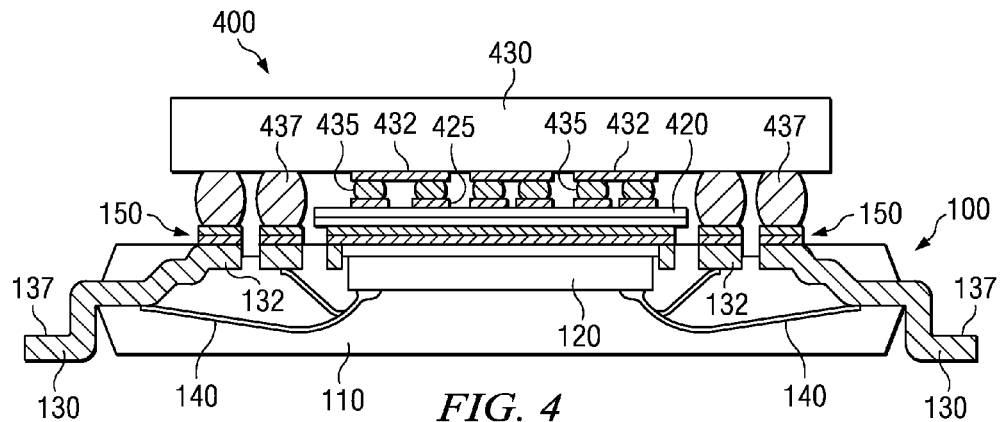
FIG. 4 is a schematic cross section depicting a forth embodiment of the invention using the semiconductor package of FIG. 1 in accordance with the present teachings.

FIG. 4 depicts a third example for semiconductor packaging using the component and method shown in FIG. 1 in accordance with the present teachings. As shown, the packaged device 400 can include a second IC chip 420 and a BGA package 430 vertically packaged on top of the package component 100 of FIG. 1. In various embodiments, the BGA package 430 can be similar to the package 330 as shown in FIG. 3.

The second IC chip 420 can be situated over the packaging component 100, or over the integrated circuit 120. The BGA package 430 can be assembled, e.g., on top of the second IC chip 420. The BGA package 430 can include solder balls (see for example 435/437) attached or placed on a substrate surface by soldering the balls to a layer (see for example 432) of, e.g., gold/nickel/copper. The BGA package 430 can be electrically connected to the second IC chip 420 though the solder balls 435 that are attached to bond pads 425 of the second IC chip 420. The BGA package 430 can be further electrically connected to the IC 120 through solder balls 437 connected to the exposed lead segments 132 and the bond wires 140.

Figure 5:
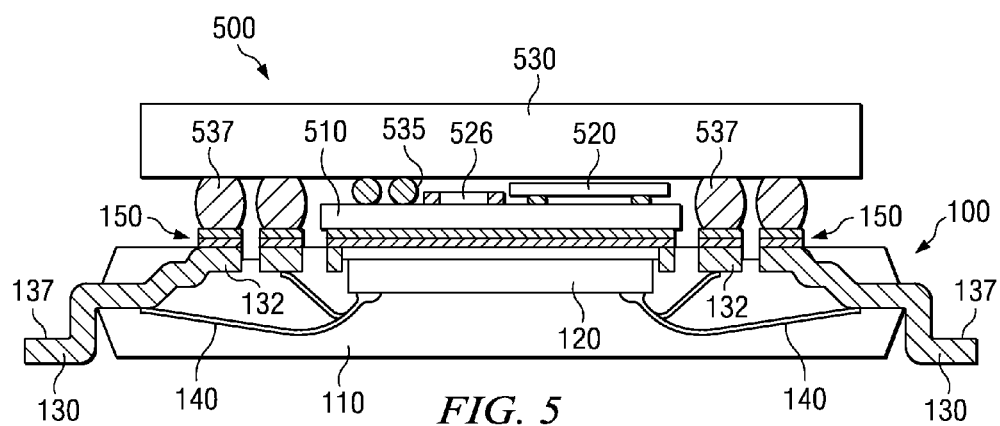
FIG. 5 is a schematic cross section depicting a fifth embodiment of the invention using the semiconductor package of FIG. 1 in accordance with the present teachings.

FIG. 5 depicts a forth example for semiconductor packaging using the component and method shown in FIG. 1 in accordance with the present teachings. The packaged device 500 can include, e.g., a printed circuit 510, a second IC 520, a passive component 526 and a BGA structure 530 assembled on top of the packaged component 100 of FIG. 1.

As shown, the printed circuit 510 can be laminated on top of the packaged component 100. On top of the printed circuit 510, the passive component 526 and the second IC 520 can be assembled and electrically connected with the printed circuit 510. The BGA structure 530 can be disposed over the passive component 526 and/or the second IC 520. In addition, the BGA structure 530 can be electrically connected to the IC 120 through solder balls 537 and the exposed lead segments 132. The BGA structure 530 can also be electrically connected with the second IC chip 520 through solder balls 535. In various embodiments, any suitable electrical connections between the elements/components can be used for the packaging devices as disclosed herein.

Figure 6:
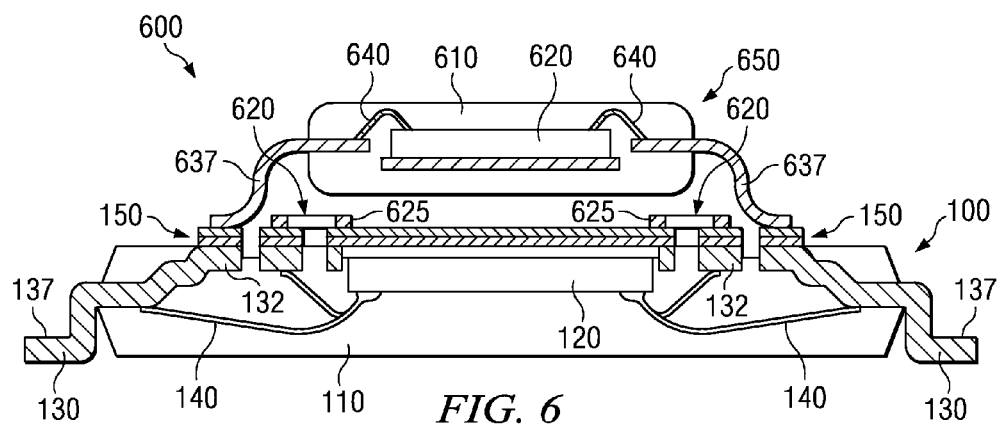
FIG. 6 is a schematic cross section depicting a sixth embodiment of the invention using the semiconductor package of FIG. 1 in accordance with the present teachings.

FIG. 6 depicts a fifth example for semiconductor packaging using the component and method shown in FIG. 1 in accordance with the present teachings. The packaged device 600 can include, e.g., passive components 620 along with a second package structure 650 assembled on top of the packaging component 100.

As shown, the passive component 620 can be electrically connected to the IC 120 through its termination 625. The passive component 620 can also be electrically connected with the exposed lead segments 132 along with bond wires 140 to communicate with the IC 120 of the packaging component 100.

The second package structure 650 can be, e.g., a second lead frame based package structure having a plurality of external lead pins 637 electrically connected to an IC chip 620 through bond wires 640. The external lead pins 637 can be an extension of a lead frame in the package 650 and can be electrically and mechanically connected to the packaging component 100. For example, the external lead pins 637 can extend outside of a mold material 610 to establish electrical connections between the IC chip 620 and the IC 120 through the exposed lead segments 132 and bond wires 140. In various embodiments, the second package structure 650, having the second IC chip 620, bond wires 640, and a portion of lead frame held in the mold material 610, can be similar to the package component 100. Likewise, a plurality of packaging components 100 can be assembled vertically through the exposed lead segments 137.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. $-1, -2, -3, -10, -20, -30$, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected.

Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for packaging comprising:
   connecting one or more components with a lead frame, wherein the one or more components comprise at least an integrated circuit;
   molding a mold material around the integrated circuit and the lead frame to form a packaging component, such that one or more external lead pins of the lead frame extend outside of the mold material for an external connection; and
   configuring the packaging component such that one or more lead segments of the lead frame are exposed from the mold material for a subsequent packaging in a vertical direction.

2. The method of claim 1, further comprising a wire bonding or a flip-chip mounting for the connection of the one or more components with the lead frame.

3. The method of claim 1, further comprising packaging one or more passive components over the packaging component, wherein each passive component is electrically connected with the integrated circuit (IC) through the exposed lead segments.

4. The method of claim 1, further comprising packaging a ball grid array (BGA) structure over the packaging component, wherein the BGA structure is electrically connected with the integrated circuit (IC) through a plurality of solder balls and the exposed lead segments.

5. The method of claim 1, further comprising packaging one or more of a ball grid array (BGA) structure and a second IC chip over the packaging component; wherein the second IC chip is disposed over the packaging component.

6. The method of claim 1, further comprising packaging one or more of a ball grid array (BGA) structure, a passive component, a second IC chip and a printed circuit over the packaging component.

7. The method of claim 6, further comprising
   laminating the printed circuit over the packaging component;
   disposing the passive component over the printed circuit and electrically connecting the passive component with the printed circuit;
   disposing the second IC chip over the printed circuit and electrically connecting the second IC chip with the printed circuit;
   connecting the BGA structure with the printed circuit through a first plurality of solder balls; and
   connecting the BGA structure with the integrated circuit in the packaging component through a second plurality of solder balls and the exposed lead segments.

8. The method of claim 1, further comprising packaging one or more of a lead frame based packaging component and a passive component over the mold material, wherein each of the lead frame based packaging component and the passive component is electrically connected with the integrated circuit through the exposed lead segments.

9. The method of claim 1, further comprising packaging one or more of a ball grid array (BGA) structure and a second IC chip over the packaging component;
   wherein the BGA structure is electrically connected with the second IC chip through a first plurality of solder balls and is electrically connected with the integrated circuit in the packaging component through a second plurality of solder balls and the exposed lead segments.

* * * * *